United States Patent [19]

Fox

[11] Patent Number: 4,688,232
[45] Date of Patent: Aug. 18, 1987

[54] DECODER FOR MANCHESTER ENCODED DATA

[75] Inventor: Trevor R. Fox, Warrington, Great Britain

[73] Assignee: International Computers Limited, London, England

[21] Appl. No.: 823,654

[22] Filed: Jan. 29, 1986

[30] Foreign Application Priority Data

Mar. 8, 1985 [GB] United Kingdom ................ 8506100

[51] Int. Cl.⁴ ............................................. H04L 27/22
[52] U.S. Cl. ...................................... 375/87; 329/50; 375/94; 360/44
[58] Field of Search ....................... 375/55, 86, 87, 94, 375/95, 110, 120; 360/42, 43, 44; 328/72, 73, 109; 329/50; 340/347 DD; 455/608; 370/108

[56] References Cited

U.S. PATENT DOCUMENTS

| | | | |
|---|---|---|---|
| 4,167,760 | 9/1979 | Decker | 375/87 |
| 4,185,273 | 1/1980 | Gowan | 340/347 DD |
| 4,339,823 | 7/1982 | Predina et al. | 375/120 |
| 4,344,041 | 8/1982 | Maine | 375/87 |
| 4,361,895 | 11/1982 | Khoudari | 360/44 |
| 4,363,002 | 12/1982 | Fuller | 375/120 |
| 4,450,572 | 5/1984 | Stewart et al. | 375/110 |
| 4,525,848 | 6/1985 | Simpson | 375/87 |
| 4,562,582 | 12/1985 | Tokura et al. | 455/608 |
| 4,592,072 | 5/1986 | Stewart | 375/110 |
| 4,606,053 | 8/1986 | Schroder | 360/42 |

Primary Examiner—Robert L. Griffin
Assistant Examiner—Stephen Chin
Attorney, Agent, or Firm—Lee, Smith & Zickert

[57] ABSTRACT

A decoder for Manchester encoded data in which the encoded data is sampled by a clock signal to produce a decoded data signal. The decoded data is combined with a delayed version of the encoded data, to produce the clock signal. In a preferred version, a tuned circuit is included to stabilize the clock signal against jitter.

8 Claims, 10 Drawing Figures

4,688,232

DECODER FOR MANCHESTER ENCODED DATA

This invention relates to decoders for Manchester encoded data.

In a Manchester encoding scheme, data is encoded as a two-level signal consisting of a succession of bit periods with a transition between levels at the mid-point of every bit period and further transitions at certain bit boundaries. For example, in one Manchester encoding scheme, a binary zero is encoded as a low-to-high transition at the mid-point, a binary one is encoded as a high-to-low transition at the mid-point, and further transitions are introduced at the boundaries of the bit periods where required, i.e. between adjacent bits of the same value.

Such a code has the advantage of being self-clocking, i.e. it contains both data and clock information, and is useful in digital data transmission systems, e.g. for transmitting data from one processing unit to another.

In order to decode such a signal, the conventional procedure is first to extract the clock signal from the encoded signal and then to combine the clock signal with the encoded signal so as to obtain the decoded data. The clock signal may be extracted, for example, by means of a phase-locked loop. The decoded data may be obtained by combining the extracted clock signal with the encoded data in an exclusive-OR gate, or by using the clock to sample the encoded data at a fixed point in each bit period.

One object of the present invention is to provide an alternative form of Manchester decoder circuit.

SUMMARY OF THE INVENTION

According to one aspect of the invention, there is provided a decoder for Manchester encoded data, comprising:
  means for sampling the encoded data at a predetermined point in each cycle of a clock signal, to produce a decoded data signal, and
  means for combining the decoded data signal with the encoded data to produce said clock signal.

It can be seen that the decoder in accordance with the invention, utilises a feedback loop in which the decoded data is used to produce the clock signal, and the clock signal is used to produce the decoded data.

A problem which arises in data transmission systems is that of jitter, i.e. variations in the phase of the transmitted signal from one bit period to the next. These variations may be caused by the limited bandwidth of the transmission channel, or by noise. An excessive amount of jitter can prevent correct operation of a Manchester decoder circuit: for example, it can cause the input data to be sampled at the wrong instant, giving an incorrect output.

According to another aspect of the invention, there is provided a decoder for Manchester encoded data, comprising:
  a tuned circuit for producing a clock signal, the circuit being tuned to the expected clock frequency of the encoded data,
  means for combining the clock signal with the encoded data to produce a decoded data signal, and
  means for combining the decoded data signal with the encoded data to produce a signal for driving the tuned circuit.

It is found that the use of a tuned circuit in this way helps to reject jitter in the incoming encoded data, and thus enables the decoder to operate correctly in the presence of a higher level of jitter. It also helps to stabilise the clock signal produced by the decoder.

When a Manchester decoder is switched on, it may initially lock on to the wrong phase of the incoming encoded data, i.e. it may interpret transitions at the boundaries of the bit periods as mid-point transitions and vice-versa. It has been found that the use of a tuned circuit tends to perpetuate this incorrect decision, and hence tends to prevent the decoder from locking on to the correct phase.

This problem may be overcome by including means for detecting that the decoder has locked on to the wron phase of the encoded data, and means for re-synchronising the tuned circuit so as to lock the decoder on to the correct phase. The means for detecting that the decoder has locked on to the wrong phase may comprise a circuit for comparing the levels of the encoded data in the first and second halves of each bit period as defined by the clock signal, and for indicating a phase error if these levels are equal. The means for re-synchronising the tuned circuit may comprise means for inverting the signal which drives the tuned circuit.

According to a further aspect of the invention, there is provided a decoder for Manchester encoded data, comprising:
  a tuned circuit for producing first and second clock signals of opposite phase, the circuit being tuned to the expected clock frequency of the encoded data,
  means for deciding which of the first and second clock signals has the correct phase relative to the encoded data, and
  means for utilising the clock signal with the correct phase to produce a decoded data signal and also to produce a signal for driving the tuned circuit.

The means for deciding which clock signal has the correct phase may comprise means for detecting a long pulse in the encoded data (i.e. a level which exists for a whole clock beat) and means for comparing the alignment of the long pulse with the first and second clock signals.

Various embodiments of the invention will now be described, by way of example, with reference to the accompanying drawings.

DETAILED DESCRIPTION

Figure 1:
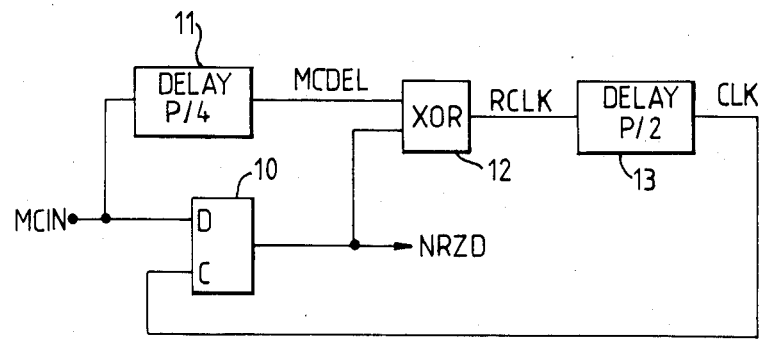
FIGS. 1, 3, 5, 7 and 9 are circuit diagrams of five Manchester decoders in accordance with the invention.
Figure 2:
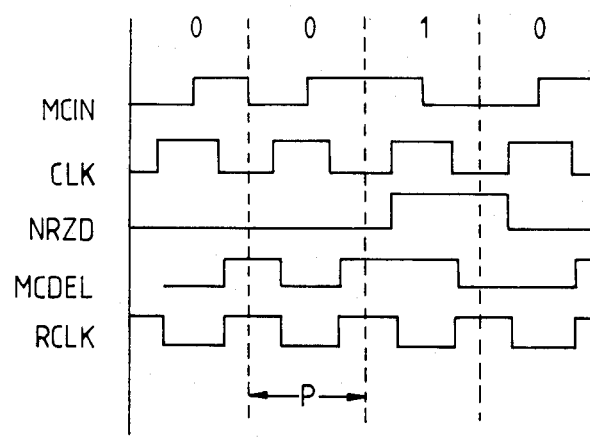
FIGS. 2, 6 and 8 are waveform diagrams illustrating the operation of the decoders shown in FIGS. 1, 5 and 7 respectively.

FIGS. 1 and 2

FIG. 1 shows a first decoder in accordance with the invention, and FIG. 2 shows the waveforms of various signals in this decoder.

The decoder receives a Manchester encoded signal MCIN, having a bit period of length P. Typically, P is equal to 20 nanoseconds, so that the bit rate of the signal MCIN is 50 Mbits/second. A zero is represented by a low-to-high transition at the mid-point of a bit period, while a one is represented by a high-to-low transition at the mid-point. Where two successive bits have the same value, a further transition is necessary at the boundary between the bits.

The signal MCIN is applied to the data input of a D-type bistable (flip-flop) 10, which is clocked by the rising edge of a clock signal CLK. As can be seen in FIG. 2, the rising edge of CLK occurs one quarter of the way through the bit period, so that the bistable 10 samples the value of MCIN during the first half of each bit period. The bistable 10 is therefore set to its "1" state if the data represents a "1", and is set to its "0" state if the data represents a "0". The output of the bistable 10 therefore provides a data signal NRZD which represents the decoded data output of the decoder, in non-return-to-zero form.

The encoded input signal MCIN is also fed to a delay circuit 11 which delays it by P/4, producing a signal MCDEL. The signals MCDEL and NRZD are combined in an exclusive—OR gate 12, to produce a signal RCLK. This is fed to a second delay circuit 13 which delays it by P/2, producing the clock signal CLK referred to above.

Thus, it can be seen that the decoder contains a feedback loop in which the clock signal CLK is used to derive decoded data signal NRZD, while the data signal NRZD is used to derive the clock CLK. This loop very quickly locks on to the incoming encoded signal MCIN to synchronise the clock CLK in the correct phase relationship to the incoming data.

FIG. 3

Figure 3:
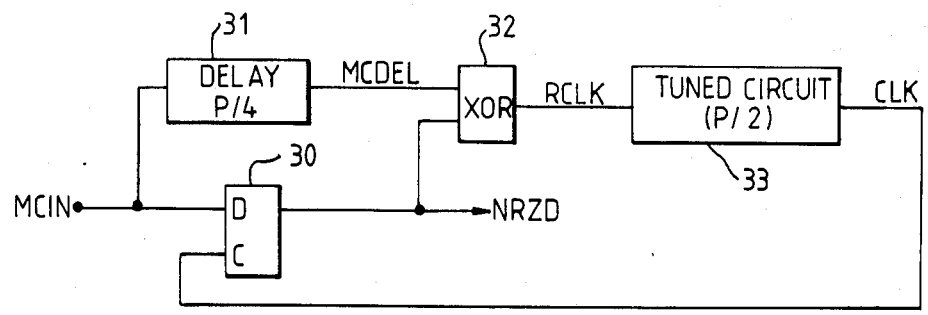

Referring now to FIG. 3, this shows a modification of the decoder of FIG. 1, in which the problem of jitter is reduced. The circuit is similar to that of FIG. 1, and includes a bistable 30, delay circuit 31, and exclusive - OR gate 32 corresponding to the elements 10, 11, 12 in FIG. 1. In this case, the delay circuit 13 of FIG. 1 is replaced by a tuned circuit 33. This tuned circuit is tuned to the expected clock frequency of the incoming data, and has an overall delay of P/2.

Logically, the circuit of FIG. 3 operates in the same way as that of FIG. 1, and hence the waveform diagrams of FIG. 2 also apply. The tuned circuit 33 behaves as a very selective filter which filters the signal RCLK to let only the fundamental frequency through. This greatly improves the tolerance of the decoder to jitter in the incoming signal, and also reduces the amount of jitter in the derived clock signal CLK, which is important if the clock CLK is to be used for further transmission.

FIG. 4

Figure 4:
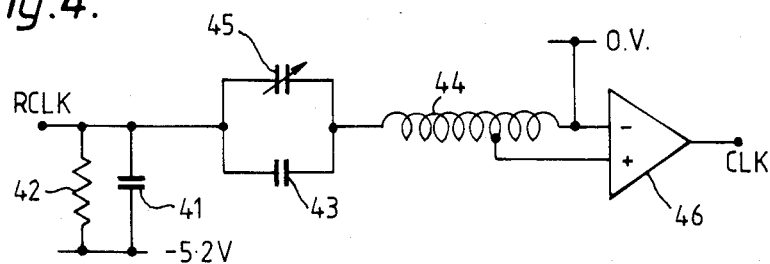
FIG. 4 is a detailed circuit diagram of a tuned circuit forming part of the decoder of FIG. 3.

Referring now to FIG. 4, this shows the tuned circuit 33 in detail.

The circuit is designed to receive its input signal RCLK from an emitter-follower output. Hence, in this example, it is assumed that the exclusive-OR gate 32 which produces the signal RCLK has an emitter-follower output stage. The gate 32 may, for example, comprise a Motorola MC10107 type circuit.

The input terminal 40 which receives RCLK is connected to a −5.2 volt supply by way of a 330 pF capacitor 41 and a 180 ohm resistor 42 connected in parallel. The terminal 40 is also connected through a 33 pF capacitor 43 to one end of a 300 mH inductor 44. The capacitor 43 has a 2-20 pF variable capacitor 45 connected in parallel with it for tuning purposes. The other end of the inductor 44 is connected to a zero voltage level. The output of the tuned circuit is obtained from an operational amplifier 46, the negative input of which is connected to the zero voltage level and the positive input of which is connected to a tapping point on the inductor 44, dividing the inductor in a 3:1 turns ratio. The inductor 44 is conveniently formed by tracks on the printed circuit board which carries the other components. The operational amplifier 46 may be a SP9680 type circuit.

In operation, the variable capacitor 45 is adjusted so as to tune the resonant frequency of the circuit to the optimum operating point, corresponding to the clock frequency of the incoming signal.

In this example, the values of the components in the tuned circuit were chosen such that the overall delay introduced by the circuit has the required value P/2. However, in other embodiments of the invention, it may be necessary to include a separate delay circuit in series with the tuned circuit to provide the correct delay.

One particular application of a Manchester decoder is in a data transmission system for transmitting data between two or more processors. In one such system, when the system is initially switched on, it is arranged to transmit repeatedly a null pattern, consisting of seven zeroes followed by a single one.

Initially, therefore, the decoder receives a string of zeroes, which is represented by a square wave of period P, i.e. by a series of pulses of duration P/2. Such a pattern can be interpreted either as a stream of zeroes, or as a stream of ones, depending on the phase of the clock CLK relative to the data. Thus, when the decoder is switched on, it may initially lock on to the wrong phase of the data.

The decoder shown in FIG. 1 is able to decide between the two possibilities as soon as the first data "1" arrives. This produces a long pulse of duration P which is unambiguous and which is sufficient to correct the phase of the clock CLK. The decoder is then locked to the correct phase of the data and is able to operate correctly thereafter.

However, in the case of FIG. 3, if the decoder initially locks on to the wrong phase of the data, it is found that a single "1" is insufficient to correct it. This is due to the inertia, or flywheel effect, of the tuned circuit 33: it will tend to go on generating the clock CLK in the same phase even though RCLK changes phase.

One solution to the problem would be to use a different null pattern, e.g. one containing a sequence of alternating ones and zeroes. This would give a succession of data transitions, to overcome the inertia of the tuned circuit. However, such a null pattern may be undesirable or inconvenient. It is therefore desirable to provide a decoder circuit which will correctly lock on to the null pattern originally described.

FIGS. 5 & 6

Figure 5:
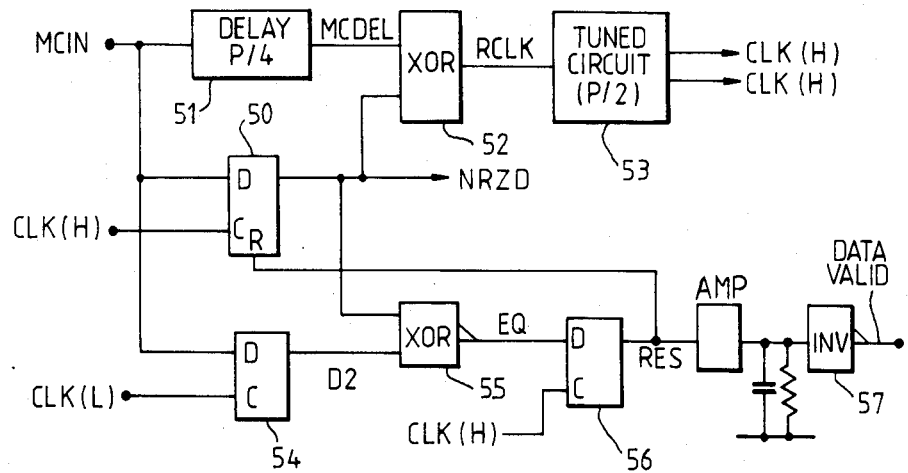
Figure 6:
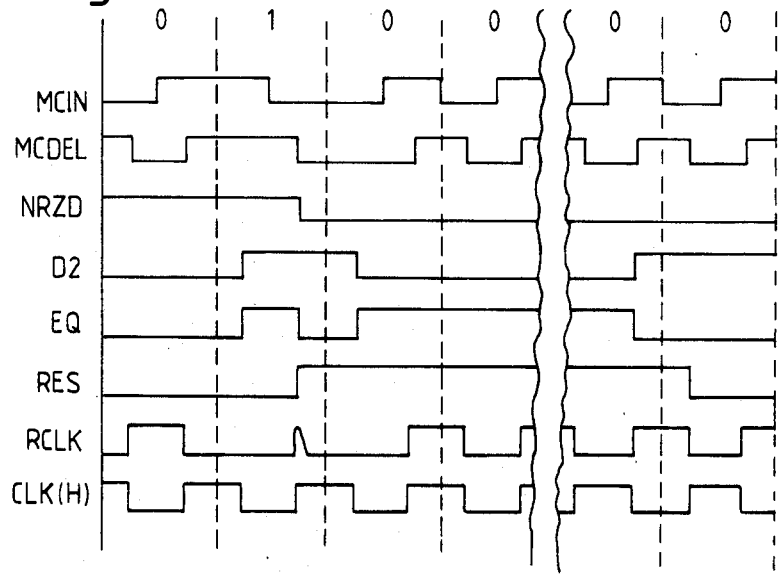

FIG. 5 shows another embodiment of the invention, which overcomes this problem, and FIG. 6 shows the waveforms of various signals in FIG. 5.

The circuit comprises a bistable 50, delay circuit 51, exclusive-OR gate 52 and tuned circuit 53 similar to the elements 30-33 in FIG. 3. In this case, the tuned circuit 53 provides a pair of complementary clock signals CLK(H) and CLK(L). CLK(H) corresponds to the signal CLK in FIG. 3, and is fed to the clock input of the bistable 50. CLK(L) is the inverse of CLK(H), and is fed to the clock input of a further bistable 54. The incoming encoded data signal MCIN is fed to the data inputs of both bistables 50 and 54.

The output NRZD Of bistable 50, and the output D2 of bistable 54, are fed to the inputs of an inverting exclusive - OR gate 55, producing an output signal EQ which is true if NRZD and D2 are equal. EQ is fed to the data input of a further bistable 56 which is clocked by CLK(H). The output of the bistable 56 is a signal RES which is fed to the reset input of the bistable 50.

If the clock CLK(H) is in the correct phase relative to the data, it will cause the bistable 50 to sample MCIN during the first half of each bit period, as in the case of CLK in FIG. 2. CLK(L) will therefore cause bistable 54 to sample MCIN during the second half of the same bit period. Since there is always a transition at the midpoint of the bit period, the levels in the halves of the bit period will always be opposite. Hence, in this case, the signals NRZD and D2 will be unequal. EQ will therefore remain low and so the bistable 56 will remain in its unset state.

FIG. 6 shows what happens if the clock CLK(H) locks on to the wrong phase of the data. In this case, bistable 50 samples MCIN during the second half of each bit period, and bistable 54 samples MCIN during the first half of the next bit period. Thus at the first data transition, from zero to one, the signals NRZD and D2 will have the same value. This causes EQ to go high, which sets the bistable 56, producing the signal RES. This resets the bistable 50, and holds it in the reset state for as long as the clock CLK(H) remains in the wrong phase.

This has the effect of inverting RCLK for a few bit periods until the inertia of the tuned circuit is overcome. The break in the waveforms in FIG. 6 represents the period of time during which this happens. Eventually, when the tuned circuit becomes synchronised in phase with RCLK, EQ goes low again, allowing normal operation to continue.

The signal RES is also fed to an inverter gate 57, to produce a DATA VALID signal when the clock is correctly synchronised.

FIGS. 7 & 8

Figure 7:
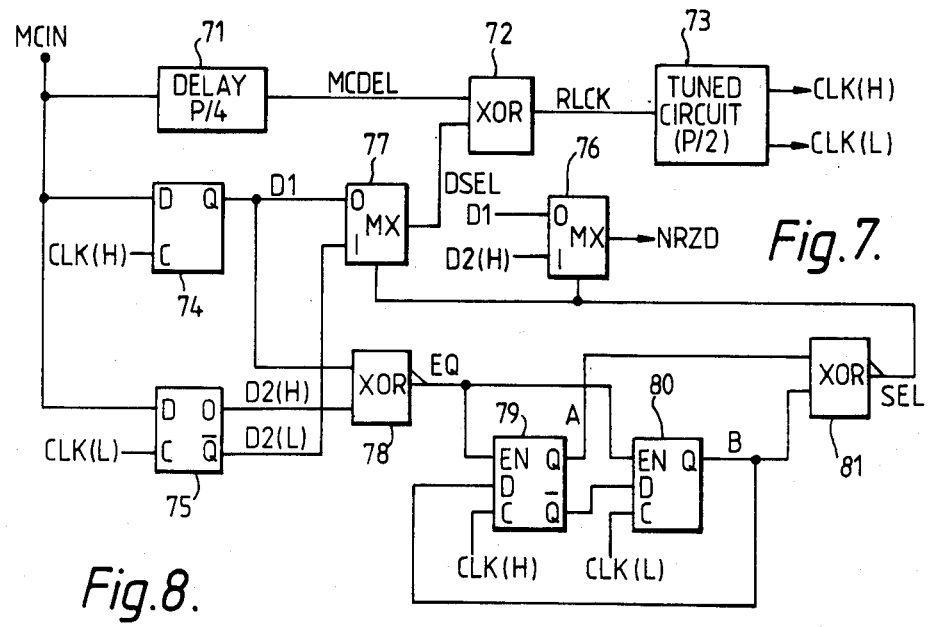

FIG. 7 shows another embodiment of the invention, which does not require any special null pattern for synchronisation: it will correctly synchronise itself on the first long pulse received, i.e. the first transition between zero and one in the code described above.

Referring to FIG. 7, the decoder comprises a delay circuit 71, exclusive - OR gate 72 and tuned circuit 73 similar in function to elements 51, 52, 53 of FIG. 5. The incoming encoded data signal MCIN is fed to the data inputs of two bistables 74, 75 which are clocked by signals CLK(H) and CLK(L) respectively A multiplexer 76 selects either the output D1 of bistable 74 or the output D2(H) of bistable 75, to produce the decoded data signal NRZD. A further multiplexer 77 selects either the output D1 or the inverted output D2(L) of bistable 75, to produce a signal DSEL. This is combined in the exclusive - OR gate 72 with the delayed version MCDEL of the input data to produce the signal RCLK which drives the tuned circuit. The multiplexers 76, 77 are both controlled by a signal SEL which selects the upper inputs when SEL is low and the lower inputs when SEL is high.

The outputs of the bistables 74, 75 are compared in an inverting exclusive - OR gate 78 to produce a signal EQ when they are equal. This will occur, as can be seen from FIG. 8, whenever a long pulse occurs in the data MCIN.

The signal EQ is fed to the enable inputs of two bistables 79, 80 which are clocked by CLK(H) and CLK(L) respectively The false output $\bar{Q}$ of bistable 79 is connected to the data input of bistable 80, and the true output Q of bistable 80 is connected to the data input of bistable 79. The true outputs Q of the two bistables 79, 80 are compared in an inverting exclusive - OR gate 81 to produce the control signal SEL. Thus, SEL is high when the bistables are in the same state, and low when they are in opposite states.

Suppose that the bistables 79, 80 are initially both in the unset state, so that their outputs are both low. They will remain in this state until the rising edge of CLK(L) coincides with EQ which will cause bistable 80 to be set. The bistables then remain in this state until the rising edge of CLK(H) coincides with EQ, whereupon bistable 79 will also be set. They will then remain in this condition until the rising edge of CLK(L) coincides with EQ, whereupon bistable 80 will be reset. The circuit then remains in this state until the rising edge of CLK(H) coincides with EQ, which will reset bistable 79, returning the circuit to the initial state.

When the decoder circuit is switched on, the bistables 79, 80 may adopt either state. Hence, SEL may be either high or low, depending on whether the bistables are in the same state or opposite states. Thus, either CLK(H) or CLK(L) is selected as the clock signal for deriving the output data NRZD and for driving the tuned circuit 73. Clearly, one of these clock signals has the correct phase relationship to the data MCIN, and the other is wrong. If the wrong clock signal is chosen, this situation will be detected at the first long pulse in the data MCIN: EQ will go high and this will cause either bistable 79 or bistable 80 to change state, thus inverting SEL and causing the correct clock signal to be selected.

Figure 8:
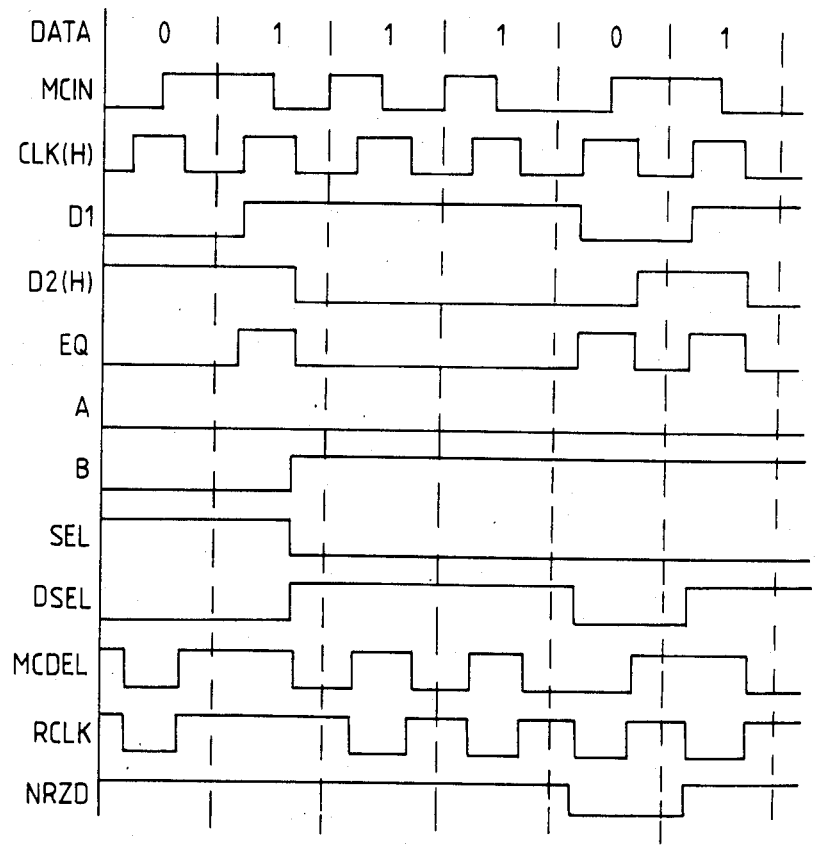

As an example, FIG. 8 shows the situation in which bistables 79, 80 are both initially in the unset state, so that both their Q outputs are low, and SEL is high. Thus, initially, the multiplexers 76, 77 select their lower inputs, and hence the signals DSEL and NRZD are both derived from the bistable 75, using CLK(L) as the clock signal. It is assumed in this example that this is incorrect, and that the clock CLK(H) is the one in the correct phase relationship to the data MCIN.

As shown in FIG. 8, when a long pulse occurs, EQ goes high. This is still high at the rising edge of CLK(L) and so bistable 80 changes state. Thus, the bistables 79, 80 are now in opposite states and so SEL goes low. Therefore, the multiplexers 76, 77 now select their upper inputs, so that DSEL and NRZD are now derived from the bistable 74, using the clock signal CLK(H). The circuit is now locked on to the correct phase of the incoming data, and will continue to decode the data correctly.

It should be noted from FIG. 8 that subsequent long pulses in the incoming data MCIN do not cause any further changes of state of the bistables 79, 80 once the circuit has been correctly synchronised. This is because the high levels of EQ still coincide with the rising edge of CLK(L) and hence have no effect on either bistable 79 or 80.

FIGS. 9 & 10

In the above description, it was assumed that a particular Manchester encoding scheme was used, in which a zero was represented by an upward transition and a one was represented by a downward transition at the midpoint of the bit period. However, it will be appreciated that the invention is equally applicable to other Manchester encoding schemes. As a simple example, a zero may be represented by an upward transition and a one by a downward transition.

Figure 10:
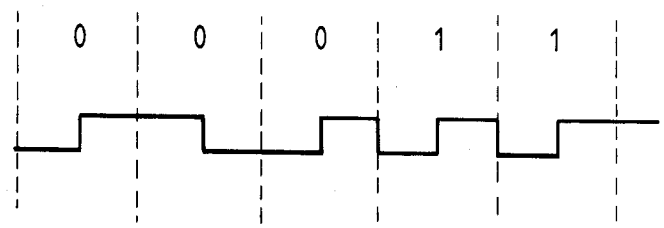
FIG. 10 is a waveform diagram illustrating an alternative form of Manchester coding which the decoder of FIG. 9 is adapted to decode.

Another possible Manchester coding scheme is shown in FIG. 10. In this scheme, there is a transition at the mid-point of every bit period; a one is represented by a transition at a bit boundary at the start of the bit period, and a zero is represented by the absence of a transition at a bit boundary at the start of the bit period. This scheme is referred to as a Manchester differential code.

It can be seen that, in this coding scheme, in the case of a one, the level in the first half of the bit period is equal to the level in the first half of the preceding bit period; in the case of a zero, these levels are unequal.

Figure 9:
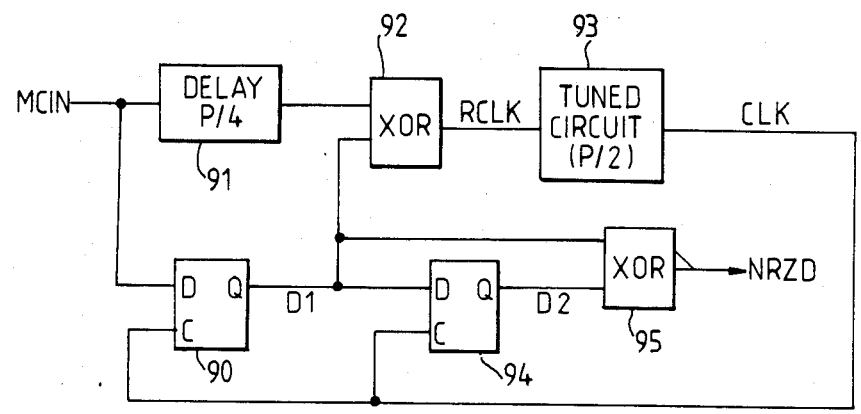

Referring now to FIG. 9, this shows a decoder for use with this coding scheme. The decoder includes a bistable 90, delay 91, exclusive - OR gate 92, and tuned circuit 93 similar in function to the elements 30–33 in FIG. 3. The output D1 of bistable 90 is connected to the data input of another bistable 94, both these bistables being clocked by CLK. The output D2 of bistable 94 is compared with D1 in an inverting exclusive - OR gate 95, to produce an output decoded data signal NRZD.

It can be seen that the signal D1 represents the level of the input signal MCIN in the first half of the bit period, as in the case of FIG. 3. The signal D2 represents the value of D1 in the preceding bit period. Hence, the output signal NRZD represents the true decoded data, in non-return-to-zero form.

The circuit shown in FIG. 9 is correctly synchronised by the standard null pattern (seven zeroes followed by a one) referred to above. The consecutive zeroes are represented, in this coding scheme, by a sequence of long pulses, which are sufficient to overcome the inertia of the tuned circuit 93 so as to allow it to lock on to the correct phase of the data.

It will be appreciated that the differential coding scheme shown in FIG. 10 could also be used with the circuit of FIG. 7, with the addition of suitable circuits similar to the bistable 94 and exclusive - OR gate 95 of FIG. 9 for converting the data into the correct form.

I claim:

1. A decoder for Manchester encoded data, comprising:
   (a) means for sampling the encoded data at a predetermined point in each cycle of clock signal, to produce a decoded data signal,
   (b) first delay means for delaying the encoded data signal by one-quarter of a period of an expected clock frequency of the encoded data, to produce a delayed encoded data signal,
   (c) an exclusive-OR gate having a first input connected to receive the delayed encoded data signal, a second signal input connected to receive the decoded data signal, and an output which provides a control signal, and
   (d) second delay means for delaying said control signal by one-half of a period of said expected clock frequency, to produce said clock signal.

2. A decoder for Manchester encoded data, comprising:
   (a) a tuned circuit for producing a clock signal, the circuit being tuned to an expected clock frequency of the encoded data,
   (b) means for combining the clock signal with the encoded data to produce a decoded data signal,
   (c) delay means for delaying the encoded data by one-quarter of a period of said expected clock frequency, to produce a delayed data signal, and
   (d) an exclusive-OR gate having a first input connected to receive the delayed encoded data signal, a second input connected to receive the decoded data signal, and an output which provides a signal for driving the tuned circuit.

3. A decoder according to claim 2 wherein the means for combining the clock signal with the encoded data comprises a D-type bistable having a data input connected to receive the encoded data, a clock input connected to receive the clock signal, and a data output which provides said decoded data signal.

4. A decoder according to claim 2 further comprising:
   (a) means for detecting that the decoder has locked on to the wrong phase of the encoded data and
   (b) means responsive to said detecting means, for re-synchronising said tuned circuit, thereby locking the decoder on to the correct phase of the encoded data.

5. A decoder according to claim 2 wherein the tuned circuit introduces a delay between said signal for driving the tuned circuit and said clock signal, equal to one-half of a period of said expected clock frequency.

6. A decoder according to claim 2, wherein the encoded data is encoded by means of a Manchester differential code, and wherein the decoder further comprises means for combining said decoded data signal with a delayed version thereof to produce an output non-return-to-zero signal.

7. A decoder according to claim 4 wherein the detecting means comprises means for comparing values of said encoded data in first and second halves of each cycle of said clock signal and for producing a reset signal wherever said values are equal.

8. A decoder for Manchester encoded data, comprising:
   (a) a tuned circuit for producing first and second clock signals of opposite phase, the circuit being tuned to an expected clock frequency of the encoded data,
   (b) means for producing a selection signal indicative of which of the first and second clock signals has a correct phase relative to the encoded data,
   (c) means for combining the first and second clock signals with the encoded data to produce repective first and second decoded data signals,
   (d) means responsive to said selection signal for selecting between the first and second decoded data signals to produce a selected decoded data signal,
   (e) delay means for delaying the encoded data by one-quarter of a period of said expected clock frequency, to produce a delayed encoded data signal, and
   (f) an exclusive-OR gate having a first input connected to receive the delayed encoded data signal, a second input connected to receive the selected decoded data signal, and an output which provides a signal for driving the tuned circuit.

* * * * *